United States Patent [19]
Kodama et al.

[11] Patent Number: 5,917,841
[45] Date of Patent: Jun. 29, 1999

[54] CODE ERROR DETECTING CIRCUIT

[75] Inventors: Yukio Kodama; Kazuo Murakami, both of Tokyo, Japan

[73] Assignee: Mitsubishi Denki Kabushiki Kaisha, Tokyo, Japan

[21] Appl. No.: 08/748,509

[22] Filed: Nov. 8, 1996

[30] Foreign Application Priority Data

Mar. 13, 1996 [JP] Japan ................................ 8-056128

[51] Int. Cl.⁶ ........................ G06F 11/10; G06F 11/00
[52] U.S. Cl. ........................ 371/53; 371/37.7; 371/67.1
[58] Field of Search .................... 371/53, 54, 37.7, 371/37.6, 39.1, 40.4, 67.1; 364/761, 765, 767

[56] References Cited

U.S. PATENT DOCUMENTS

| | | | |
|---|---|---|---|
| 3,648,238 | 3/1972 | Yarrington | 371/39.1 |
| 3,733,477 | 5/1973 | Tate et al. | 364/767 |
| 4,506,365 | 3/1985 | Collins | 371/40.4 |
| 5,495,488 | 2/1996 | Nakamura | 371/37.12 |
| 5,504,758 | 4/1996 | Inoue et al. | 371/42 |

FOREIGN PATENT DOCUMENTS 4-81896  12/1992  Japan .

*Primary Examiner*—Trinh L. Tu
*Attorney, Agent, or Firm*—Leydig, Voit & Mayer

[57] ABSTRACT

A Cyclic Redundancy Check (CRC) code word except a fixed pattern is provided to a code data input terminal of a division circuit in synchronization with a clock signal and divided at the division circuit, then, a remainder data of the division result is outputted from output terminals. The remainder data outputted from the output terminals is compared with a CRC inherent value at a comparison circuit, and a comparison result signal indicating whether the CRC code word includes errors is outputted. A temporary memory means takes in the comparison result signal in response to rise of a clock signal inputted into a clock signal input terminal, temporarily stores it, then output its storage contents as an error detecting signal via an output node.

15 Claims, 12 Drawing Sheets

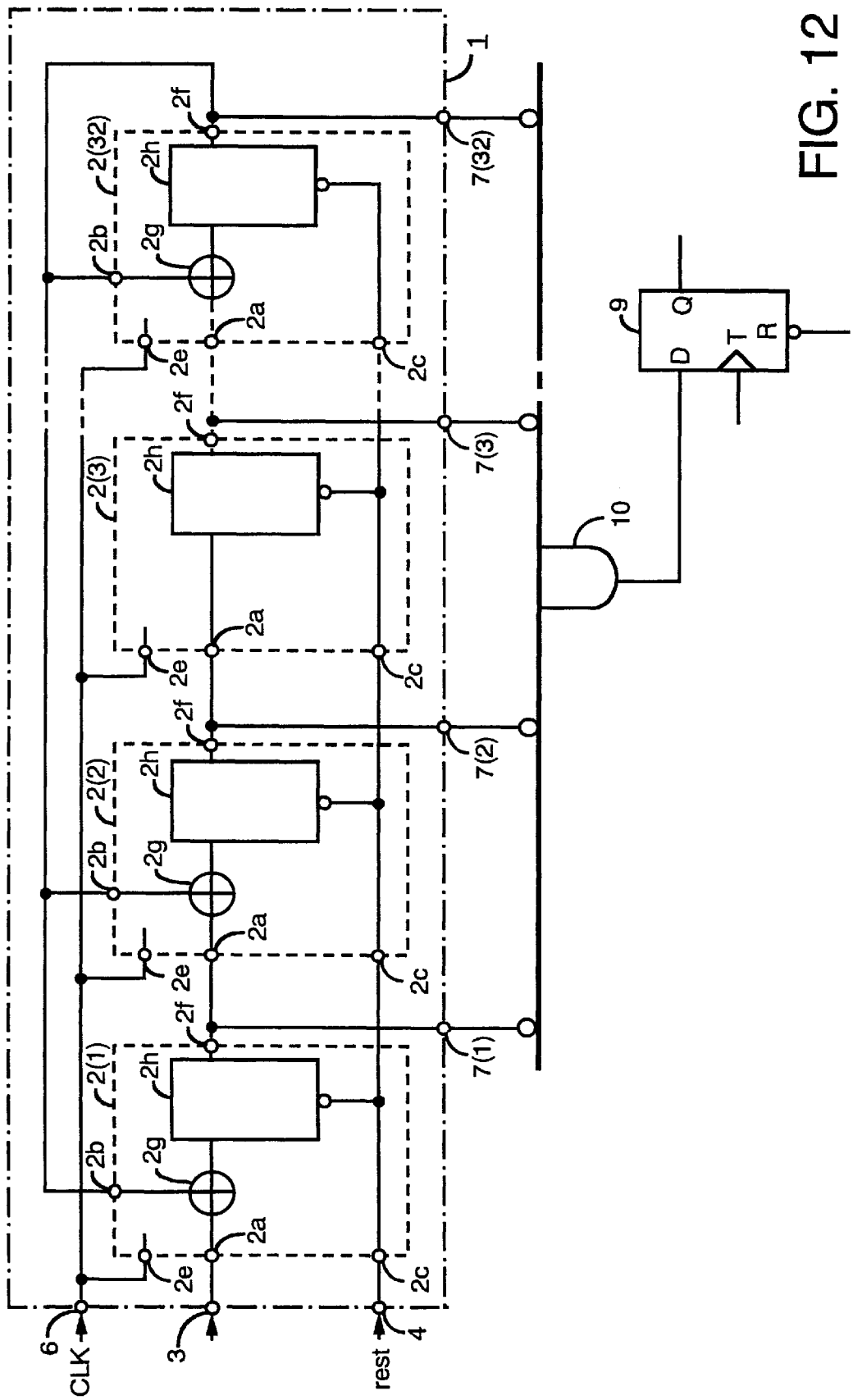

CODE ERROR DETECTING CIRCUIT

BACKGROUND OF THE INVENTION

1. Field of the Invention

The invention relates to a code error detecting circuit used for a CD-ROM MODEl, or a CD-ROM MODE 2, for example, and more specifically relates to a Cyclic Redundancy Check (hereafter, CRC) circuit for detecting errors using a CRC code or an (Error Detection Code) code (hereafter, these are referred to as CRC code) used in a field such as communication or stored media.

2. Description of the Prior Art

A CRC code word in a CD ROM MODE 1, for example, is constructed by a fixed pattern for synchronization, a data subsequent to the fixed pattern, and an error detection code (CRC code) given to this fixed pattern and data. A CRC circuit for detecting code errors as a block of CRC code word is recited in Japanese Patent Publication No. 4-81896.

The CRC circuit disclosed in this Japanese Patent publication comprises a NOR circuit and a division circuit comprised of a plurality of shift registers and an initialization set-up means. A data of CRC code and the CRC code word are inputted into the NOR circuit. The output of the NOR circuit is inputted into the division circuit. If all of bits from each division are "0", it indicates that the CRC code word does not include errors, while if one or more bits from each division are "1", it indicates that the CRC code word includes errors. The initialization set-up means sets an initial state of the registers to the same state as that which is obtained when the fixed pattern of the CRC code is successively inputted.

SUMMARY OF THE INVENTION

It is an object of the present invention to provide a code error detecting circuit for rapidly detecting code errors.

It is another object of the present invention to provide a code error detecting circuit for accurately and rapidly detecting errors even in the case where data is intermittently inputted, and not inputted during every clock pulse of a clock signal, although the CRC code word is in synchronization with the clock signal.

It is further object of the present invention to obtain a code error detecting circuit for detecting errors for the subsequent CRC code word while checking a CRC code word.

According to one aspect of the invention, a code error detecting circuit comprises a division circuit for dividing an inputted CRC code word, except a fixed pattern, by a generating a polynomial expression g (x) of the CRC code word and outputting a remainder data of its division result; and a comparison circuit for comparing the remainder data from the division circuit with a comparison data, for outputting a comparison result signal which means that the CRC code word does not include errors in the case where the remainder data is identical with the comparison data, and alternatively which means that the CRC code word includes errors in the case where the remainder data is not identical with the comparison data.

Preferably, the code error detecting circuit further comprises a temporary memory means for temporarily storing a comparison result signal from the comparison circuit and outputting its storage contents as an error detecting signal.

Preferably, the division circuit in the code error detecting circuit comprises respective memory means at a plurality of stages which correspond to a plurality of output terminal for outputting a remainder data comprised of a plurality of bits, wherein the CRC code word is divided by a generating polynomial expression; the memory means are classified into a first group and a second group according to the generating polynomial expression, wherein the first group memory means comprises a first input node, a second input node, an output node, a logical circuit for carrying out an exclusive OR operation for data inputted into the first input node and the second input node, and a memory portion for taking in an output from the logical circuit in synchronization with an inputted clock signal, storing the taken-in contents, and outputting it to the output node;

the second group memory means comprises a first input node, and an output node, and a memory portion for taking in an output from the first input portion in synchronization with an inputted clock signal, storing the taken-in contents, and outputting it to the output node; wherein the CRC code word except the fixed pattern is inputted into the first input node of the first stage memory means; the respective first input node of the memory means in the first and subsequent stages is connected to the respective output node of the memory means at the immediately preceding stage thereof; and the respective second input node of the memory means in the first group is connected to the output node of the memory means at the last stage.

According to another aspect of the invention, a code error detecting circuit comprises a division circuit for dividing an inputted CRC code word and outputting a remainder data of a division result; and a detecting means for receiving a data based on the division result from the division circuit and outputting an error detecting signal indicating whether the CRC code word includes errors in the received data, wherein the division circuit comprises respective memory means at a plurality of stages which correspond to a plurality of output terminal for outputting a remainder data comprised of a plurality of bits, wherein the CRC code word is divided by a generating polynomial expression; wherein the memory means are classified into a first group and a second group according to the generating polynomial expression, wherein the first group memory means comprises a first input node, a second input node, an output node, a logical circuit for carrying out an exclusive OR operation for data inputted into the first input node and the second input node, and a memory portion comprising a selector including a first input node, a second input node for receiving an output of the logical circuit, an output node, and a selection input node for outputting either one of the data inputted into the first input node or the second input node to the output node according to a data input control signal inputted into the selection input node, and a memory circuit for taking in an output of the output node of the selector, storing the taken-in contents, and outputting it to the output node and the second input node of the selector; and the second group memory means comprises a first input node, and an output node, and a memory portion comprising a selector including a first input node for receiving a data input, a second input node, an output node and a selection input node for outputting either one of the data inputted into the first input node or the second input node to the output node according to a data input control signal inputted into the selection input node, and a memory circuit for taking in an output of the output node of the selector, storing the taken-in contents, and outputting it to the output node and the second input node of the selector; wherein the CRC code word except the fixed pattern is inputted into the first input node of the first stage memory means; the respective first input node of the memory means in the first and subsequent stages is connected to the respective output node of the memory means at the immediately preceding stage thereof; and the respective second input node of the memory means in the first group is connected to the output node of the memory means at the last stage.

According to further aspect of the invention, a code error detecting circuit comprises a division circuit for dividing an inputted CRC code word and outputting a remainder data of a division result; and a detecting means for receiving a data based on the division result from the division circuit and outputting an error detecting signal indicating whether the CRC code word includes errors in the received data; wherein the detecting means comprises a detecting portion for detecting whether the CRC code word includes errors according to the data based on the division result from the division circuit and a temporary memory means for temporarily storing an output from the detecting portion and outputting its storage contents as an error detecting signal.

BRIEF DESCRIPTION OF THE DRAWINGS

FIG. 12 shows a circuit configuration of a sixth embodiment of the present invention.

DETAILED DESCRIPTION OF PREFERRED EMBODIMENTS

Embodiment 1

A first embodiment of the present invention is explained below using FIGS. 1~4. Before explaining a code error detecting circuit of the first embodiment of the present invention, a CRC code word in CD-ROM MODE 1 used in the present embodiment is explained using FIGS. 3, 4. It is assumed here that an output of a division circuit in the code error detecting circuit of the first embodiment comprises 32 bits.

Figure 3:
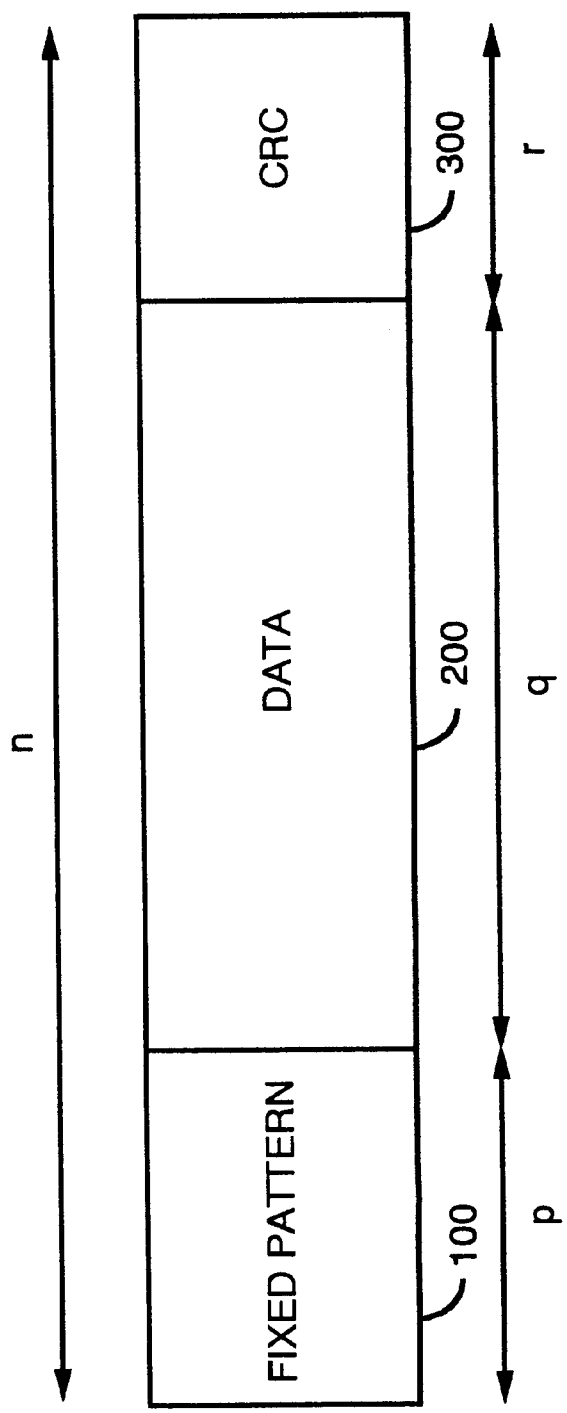
FIG. 3 shows a data format showing a CRC code word in CD-ROM MODE1 used in the present invention.
Figure 4:
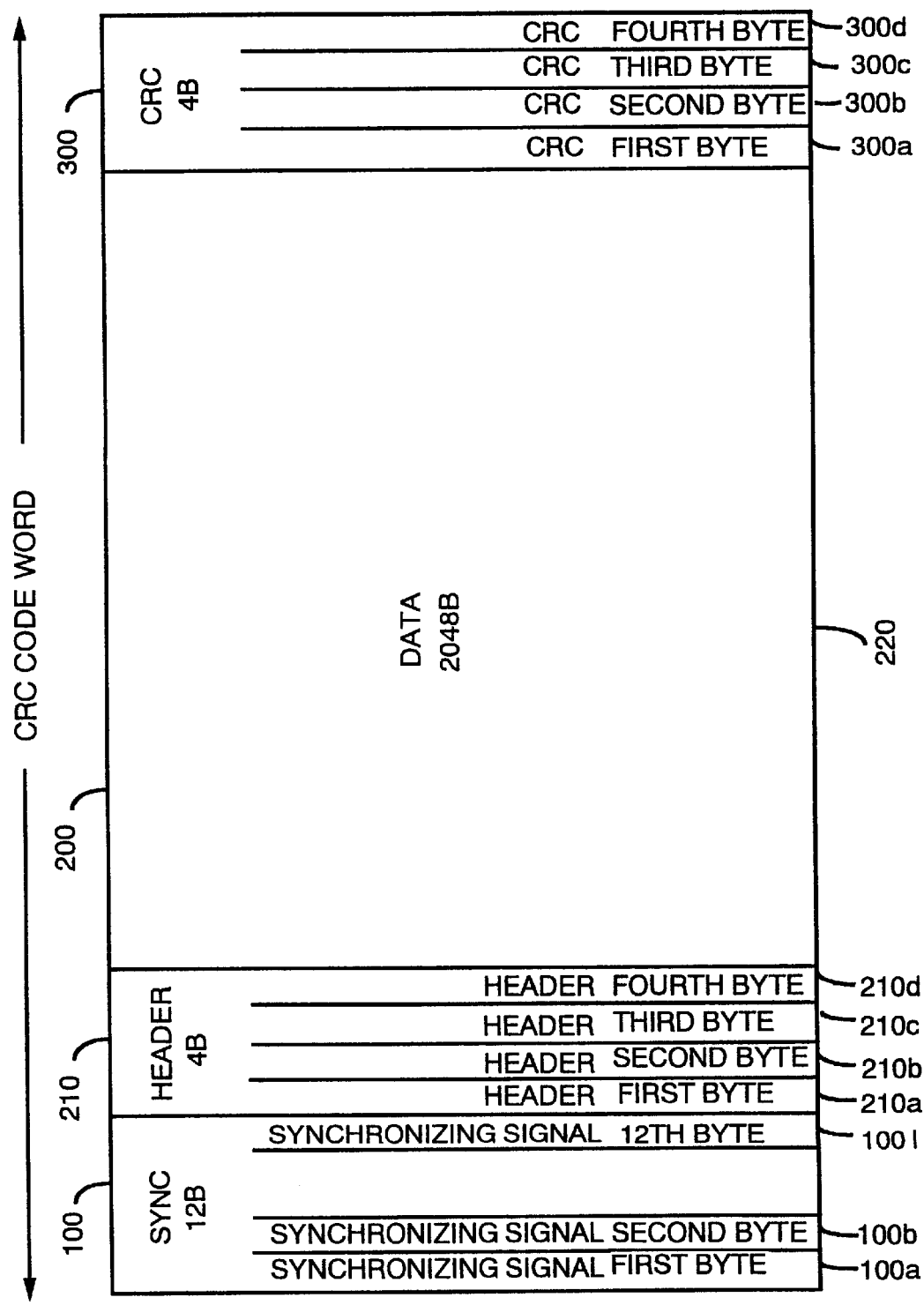
FIG. 4 is a block diagram showing a construction of the CRC code word shown in FIG. 3.

In FIG. 3, a fixed pattern 100 for synchronization having a fixed data length p comprises 12 bytes of synchronization signals 100a, 100b ... 100l, for example, as shown in FIG. 4 in detail. In the fixed pattern 100, each of the synchronization signals 100a, 100b ... 100l comprises eight bits specified with a fixed value according to the technical standard. The synchronization signals are transmitted one after another from the first synchronization signal byte 100a to the twelfth synchronization signal byte 100l. In the respective synchronization signals, the bits are transmitted one after another from the 0-th bit (LSB : Least Significant Bit), the first bit ..., the seventh bit (MSB: Most Significant Bit).

In FIG. 3, data 200 having an information data length q comprises a four-byte header portion 210 and a data portion 220. The header portion 210 includes one-byte headers 210a, 210b ... 210d and a data portion 220 includes 2048 bytes of data, for example, as shown in FIG. 4 in detail. After the synchronization signal 100 has been transmitted, the headers are transmitted one after another from the first header 210a to the fourth header 210d, and the bits in each byte are transmitted one after another from the zeroth bit to the seventh bit. After then, the bytes in the data portion 220 are transmitted one after another from the first byte to the 2048th byte.

In FIG. 3, a CRC code 300 having a CRC code length r comprises four bytes of CRC codes 300a ... 300d as shown in FIG. 4 in detail. The CRC code 300 constitutes the CRC code word having a division result 0, associated with the fixed pattern 100 and the data 200. After the data 200 is transmitted, the bytes of the CRC code 300 are transmitted one after another from the first CRC detecting signal 300a to the fourth CRC detecting signal 300d. The bits in each byte are transmitted one after another from the zeroth bit to the seventh bit.

Here, the CRC code word comprising the fixed pattern 100, the data 200 and the CRC detecting data 300 has a code word length n=p+q+r in CD-ROM MODE 1.

For the CRC code word constructed above-mentioned, the following conditional equation is obtained.

A generating polynomial expression g (x) of the CRC code word defined by the technical standard (CCITT, Yellow Book) is expressed by a formula (1).

$$g(x)=x^{32}+x^{31}+x^{15}+x^{16}+x^{4}+x^{3}+x+1 \tag{1}$$

If the CRC code word M(x) is divided by the generating polynomial expression g(x) of the CRC code word, the remainder is 0. This is expressed by the following formula.

$$M(x) \bmod g(x)=0$$

On the other hand, a reception code word polynomial expression R(x) of the CRC code word is obtained by a formula (2).

$$R(x)=F(x)\cdot x^{(q+r)}+I(x)\cdot x^{r}+C(x) \tag{2}$$

Where, F(x) refers to a fixed pattern polynomial expression, a data polynomial expression as I(x), C(x) refers to a CRC code polynomial expression, n refers to a code word length, p refers to a fixed value data length, q refers to an information data length, and r refers to a CRC code length.

Since the reception code word polynomial expression R(x) can be expressed by a formula (3), the formula (2) can be expressed as a formula (4).

$$R(x) \bmod g(x) = 0 \quad (3)$$

$$\{F(x) \cdot x^{(q+r)} + I(x) \cdot x^r + C(x)\} \bmod g(x) = 0 \quad (4)$$

A formula (5) is obtained by deforming the formula (4), then, a relational expression expressed by a formula (6) is obtained as a result.

$$F(x) \cdot x^{(q+r)} \bmod g(x) + \{I(x) \cdot x^r + C(x)\} \bmod g(x) = 0 \quad (5)$$

$$F(x) \cdot x^{(q+r)} \bmod g(x) = \{I(x) \cdot x^r + C(x,\} \bmod g(x) \quad (6)$$

It is clear from the formula (6) that the left side of the formula (6) is an inherent value (hereafter, a CRC inherent value) obtained from the fixed pattern 100 and the code length (q+r) of the CRC code word except the fixed pattern 100, while the right side of the formula (6) is a remainder, that is, a remainder data, obtained by dividing the CRC code word except the fixed pattern 100 by the CRC generating polynomial expression g(x).

Therefore, if the CRC code word includes no error, by dividing the CRC code word except the fixed pattern 100 by the CRC generating polynomial expression g(x), the remainder data will be the same as the CRC inherent value influenced by the fixed pattern 100.

On the other hand, since the fixed pattern 100 and the respective code lengths p, q, r are determined by the technical standard in the CRC code word, the CRC inherent value becomes a predetermined value, that is, a predetermined 32-bit value in the first embodiment independently from data contents of the data 200.

Figure 1:
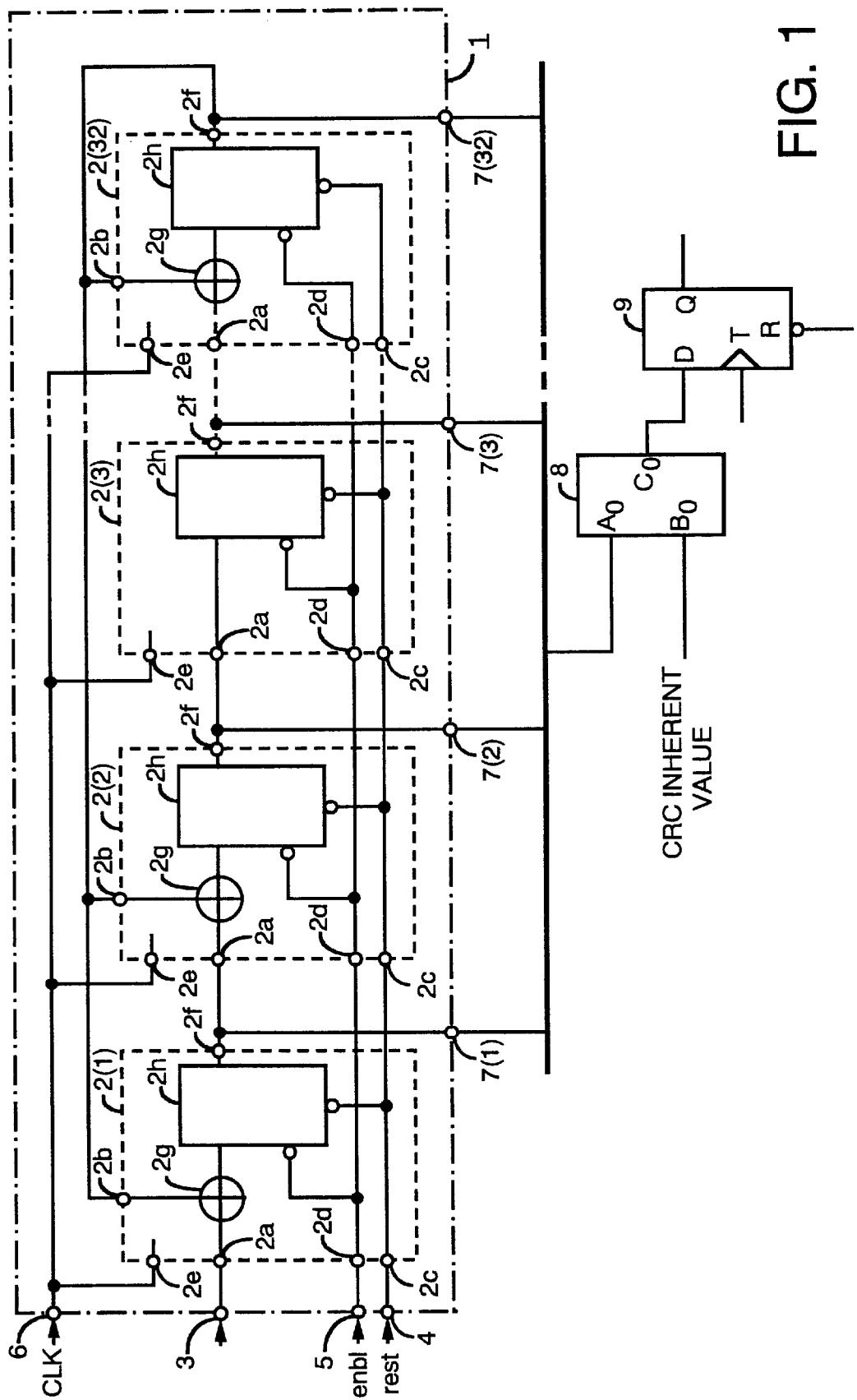
FIG. 1 shows a circuit configuration of a first embodiment of the present invention.
Figure 2:
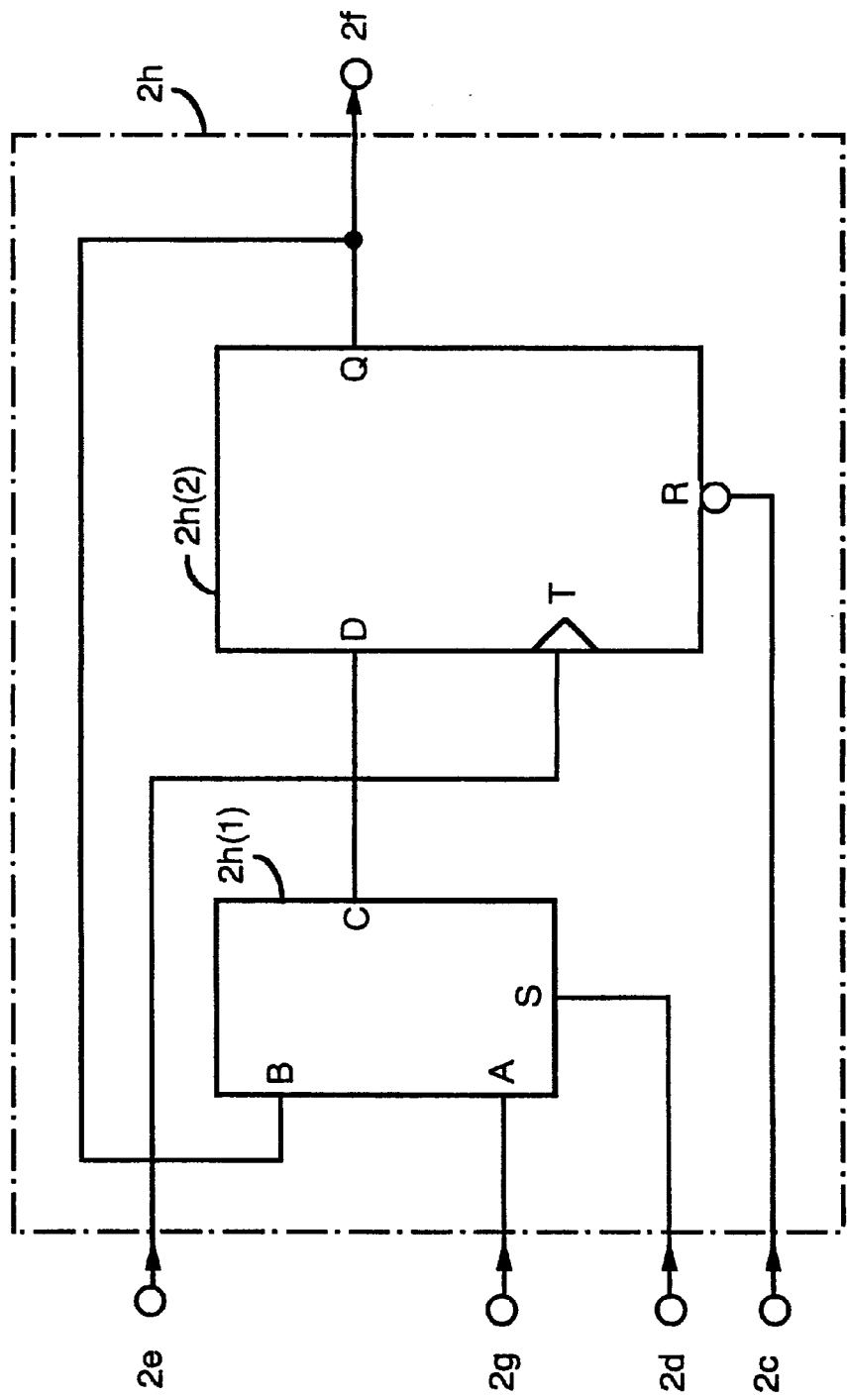
FIG. 2 shows a memory portions in memory means of the first embodiment of the present invention.

Next, the code error detecting circuit (CRC circuit) for detecting code errors of the CRC code word of such construction is explained using FIGS. 1 and 2. In FIG. 1, the division circuit 1 comprises memory means 2(1)~2(32) of a plurality of stages (32 stages in the present embodiment) for constituting shift registers, a code data input terminal 3 into which the CRC code word except the fixed pattern 100 shown in FIGS. 3, 4 is inputted in serial by one-bit width. The division circuit 1 further comprises a reset signal input terminal 4 into which a reset signal rest is inputted for setting all the storage contents of the memory means 2(1)~2(32) to an initial state, for example, "0", a data input control terminal 5 into which a data input control signal (enable signal) enbl is inputted for indicating whether the memory means 2(1)~2(32) function as shift registers or hold their own storage contents (data holding). The division circuit 1 further comprises a clock signal input terminal 6 into which a clock signal CLK is inputted for determining a timing which takes the storage contents in the memory means 2(1)~2(32), and a plurality of (32 in this embodiment) output terminals 7(1)~7(32) for outputting the remainder data which is obtained by dividing the CRC code word inputted into the code data input terminal 3 by the CRC generating polynomial expression g(x).

Figure 5:
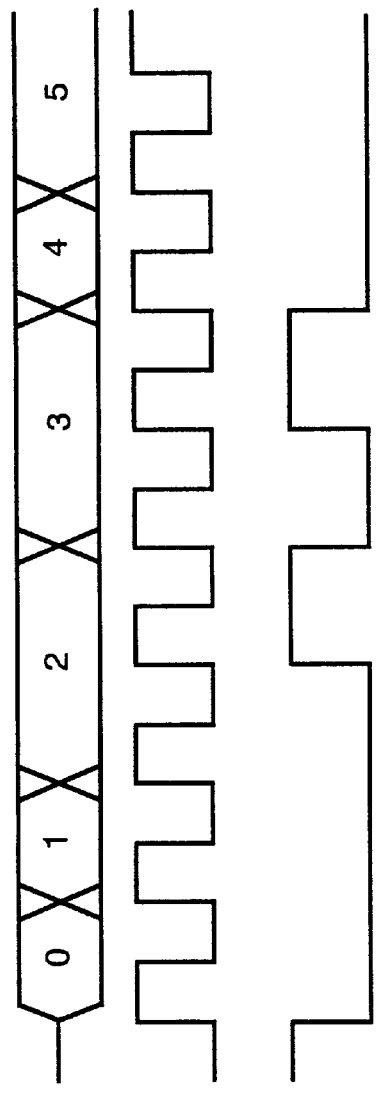
FIGS. 5A, 5B and 5C are simplified wave forms for illustrating a relationship between the CRC code word, a clock signal, and a data input control signal.

In the first embodiment, the CRC code word except the fixed pattern is inputted into the code data input terminal 3. The 0-th bit, the first bit, the second bit and so on of the CRC code word is inputted one after another in synchronization with the clock signal CLK as shown in FIGS. 5A and 5B. In FIG. 5A, the 0-th bit, the first bit, the fourth bit, and the fifth bit of the CRC code word except the fixed pattern are respectively provided corresponding to each clock period of the clock signal CLK, while the second bit and the third bit are respectively provided for every two clock periods of the clock signal CLK. At the second periods in the second bit and the third bit, no data are provided in FIG. 5A, that is, subsequent data is lacked, which is referred to as an intermittent data in this application.

In case that CRC code word except the fixed pattern inputted into the code data input terminal 3 is an intermittent data, the data input control signal enbl "H" level, which means a lack of data, in this embodiment as shown in FIG. 5C is provided to the data input control terminal 5 in synchronization with the clock signal CLK during the second periods of the second bit and the third bit of the CRC code word.

In the first embodiment, the division circuit 1 divides the CRC code word by the generating polynomial expression g(x) of the CRC code word based on the formula (1) and outputs the remainder data comprising a plurality of bits.

The memory means 2(1)~2(32) of a plurality of stages are classified into a first group and a second group according to the generating polynomial expression g(x). In the first embodiment, the seven memory means on the first, second, fourth, fifth, sixteenth, seventeenth, and thirty-second stages are included into the first group, and the other 25 memory means are included into the second group.

The respective memory means of the first group comprises a first input node 2a, a second input node 2b, a reset signal input node 2c connected to the reset signal input terminal 4, a data input control node 2d connected to the data input control terminal 5, a clock signal input node 2e connected to the clock signal input terminal 6, an output node 2f respectively connected to the corresponding output terminals 7(1)~7(32), a logic means 2g including EXCLUSIVE-OR circuits for calculating an exclusive-OR of data inputted into the first and the second input nodes 2a, 2b. The respective memory means of the first group further comprises a memory portion 2h. When the reset signal rest inputted into the reset signal input node 2c is "L" level, the storage contents are reset, or turned into "0" ("L" level) in the first embodiment.

When the reset signal rest is activated at "H" level, and the data input control signal enbl inputted into the data input control node 2d makes the memory means function as shift registers, that is, "L" level, the memory portion 2h takes in the calculated output from the logic means 2g in response to rise of the clock signal CLK, in synchronization with the clock signal CLK, temporarily stores it and at the same time outputs it to the output node 2f.

Alternatively, when the data input control signal enbl makes the data hold, that is, "H" level in the first embodiment, the memory portion 2h takes in their own outputs in synchronization with the clock signal CLK, in response to rise of the clock signal CLK, temporarily store the outputs, and at the same time outputs it to the output node 2f.

The respective memory means classified into the second group comprises a first input node 2a, a reset signal input node 2c connected to the reset signal input terminal 4, a data input control node 2d connected to the data input control tenrninal 5, a clock signal input node 2e connected to the clock signal input terminal 6, an output node 2f respectively connected to the corresponding output terminals 7(1)~7(32), and a memory portion 2h.

In the memory portion 2h, when the reset signal rest inputted into the reset signal input node 2c is "L" level, the storage contents are reset, or turned into "0" ("L" level) in the first embodiment. When the reset signal rest is activated to "H" level, and the data input control signal enbl inputted into the data input control node 2d causes the memory means to function as shift registers, that is, "L" level in this embodiment, the memory portion 2h takes in the data inputted into the first input node 23a in response to rise of the clock signal CLK, in synchronization with the clock signal CLK, temporarily stores it and at the same time outputs it to the output node 2f.

Alternatively, when the data input control signal enbl makes the data hold, that is, "H" level in the first embodiment, the memory portion 2h takes in their own outputs in synchronization with the clock signal CLK, in response to rise of the clock signal CLK, temporarily store the outputs, and at the same time outputs it to the output node 2f.

The first input node 2a of the memory means 2(1) of the first stage is connected to the code data input terminal 3, on the other hand, the first input node 2a of the memory means 2(2)~2(32) of the stages after the second stage is connected to the output node 2f of the immediately preceding memory means 2(2)~2(31), and the second input node 2b of the memory means of the first group are connected to the output node 2f of the last stage memory means 2(32).

The memory portion 2h of the respective memory means 2(1)~2(32) includes a selector 2h(1) and a flip-flop circuit 2h(2) functioning as memory circuits as shown in FIG. 2.

The selector 2h(1) in the memory means of the first group comprises a first input node A for receiving an output of the logical circuit 2g, a second input node B, an output node C, and a selection input node S connected to the data input control node 2d. In the first embodiment, when an "L" level of the data input control signal enbl is inputted into the selection input node S, the selector 2h(1) outputs the data inputted into the first input node A to the output node C, on the other hand, when an "H" level of the data input control signal enbl is inputted into the selection input node S, the selector 2h(1) outputs the data inputted into the second input node B to the output node C.

The selector 2h(1) in the memory means of the second group comprises a first input node A for receiving the data inputted into the first input node 2a, a second input node B, an output node C, and a selection input node S connected to the data input control node 2d. In the first embodiment, the selector 2h(1) outputs the data inputted into the first input node A to the output node C when the data input control signal enbl which is inputted into the selection input node S is "L" level, while it outputs the data inputted into the second input node B to the output node C when the data input control signal enbl which is inputted into the selection input node S is "H" level.

The flip-flop circuit 2h(2) comprises an input node D connected to the output node C of the selector 2h(1), an output node Q connected to the second input node B of the selector 2h(1), a reset signal input node R connected to the reset signal input node 2c, and clock signal input node T connected to the clock signal input node 2e. In the first embodiment, the storage contents of the flip-flop circuit 2h(2) turns to "0" by the "L" level of the reset signal rest, and is activated by the "H" level of the reset signal rest. The flip-flop circuit 2h(2) takes in the selected outputs from the selector 2h(1) in response to the rise of the clock signal CLK, temporarily stores the output, and then outputs the storage contents through the output node Q to the output node 2f.

In FIG. 1, a comparison circuit 8 comprises a first input terminal $A_0$ for receiving the remainder data, a second input terminal $B_0$ for receiving the CRC inherent value as comparison data (32-bit data in the first embodiment), and an output terminal $C_0$. The above remainder data which is outputted from the output terminal 7(1)~7(32) of the division circuit 1 is obtained by dividing the CRC code except the synchronization pattern 100 by the generating polynomial expression g(x). The comparison circuit 8 compares the data inputted into the first input terminal $A_0$ with the data inputted into the second input terminal $B_0$ for every bit.

If the remainder data is identical with the CRC inherent value for every bit, it means that the formula (6) is satisfied, and therefore the comparison circuit 8 outputs a comparison result signal (CRC flag) which includes no error in the CRC code word, or which indicates "H" level in the first embodiment. If at least one bit of the remainder data are not identical with the CRC inherent value, the comparison circuit 8 outputs a comparison result signal (CRC flag) which includes error in the CRC code word, or which indicates "L" level in the first embodiment. The comparison circuit 8 functions as a detecting portion for detecting whether the CRC code word includes errors based on the data of the division result from the division circuit 1.

In FIG. 1, a temporal memory means 9 comprises an input terminal D connected to the output terminal $C_0$ of the comparison circuit 8, an output terminal Q for outputting an error detecting result signal, a reset signal input terminal R for receiving the reset signal, and a clock signal input terminal T for receiving an update signal comprised of the clock signal. In the first embodiment, when the reset signal inputted into the reset signal input terminal R is "L" level, the storage contents of a flip-flop circuit constituting the temporal memory means 9 is turned to "0". On the other hand, when the reset signal inputted into the reset signal input terminal R is "H" level, the flip-flop circuit constituting the temporal memory means 9 is activated. When the temporal memory means 9 is activated, it takes in the comparison result signal from the output terminal $C_0$ of the comparison circuit 8 through the input node D at the rise of the clock signal, at the timing of comparison result between the remainder data and the CRC inherent value, that is, at the timing after every CRC code except the fixed pattern 100 is inputted into the division circuit 1 in synchronization with the clock signal CLK. Then, the temporal memory means 9 temporarily stores the comparison result signal and outputs the storage contents as an error detecting signal through the output node Q. The temporal memory means 9 constitutes a detecting means which outputs the error detecting signal indicating whether the CRC code word includes errors according to the division result from the division circuit 1 and the comparison in the comparison circuit 8.

Next, an operation of the code error detecting circuit as constructed above is explained below using FIG. 1. Before the errors of the CRC code are detected, the "L" level of the reset signals rest is provided to the reset signal input terminal 4 of the division circuit 1 and to the reset signal input terminal R of the temporal memory means 9, so that the storage contents of the flip-flop circuits 2h(2) in the memory portions 2h of the memory means 2(1)~2(32) and the storage contents of the temporary memory means 9 are reset, or initialized to "0".

After they are initialized, the reset signal turns on "H" level to set the all memory means 2(1)~2(32) in the division circuit 1 and the temporary memory means 9. In this state, the CRC code word except the fixed pattern 100 shown in FIG. SA is provided to the code data input terminal 3 of the division circuit 1 in synchronization with the clock signal CLK shown in FIG. SB.

The CRC code word except the fixed pattern 100 is inputted into the code data input terminal 3 of the division circuit 1 at this time one after another from the first byte 210a of header 210 to the fourth byte 210d of header 210, in each byte, the bits are inputted one after another from the 0-th bit to the seventh bit. Then, the bytes in the data portion 220 are inputted one after another from the first byte to the 2048th byte, in each byte, the bits are inputted one after another from the 0-th bit to the seventh bit. After then, the CRC detecting signal is inputted one after another from the first CRC detecting signal 300*a* to the fourth CRC detecting signal 300*d*, in each byte, the bites are inputted one after another from the 0-th bit to the seventh bit.

The CRC code word except the fixed pattern 100 inputted as explained above is taken in the division circuit 1 for every bit, according to the data input control signal enbl inputted into the data input control terminal 5 and the clock signal CLK inputted into the clock signal input terminal 6, and the CRC code word is divided there. The remainder data of this division result is outputted from the output terminals 7(1)~7(32) of the division circuit 1.

This operation is further explained below in detail. The data input control signal enbl inputted into the data input control terminal 5 is in the "L" level when the CRC code word except the fixed pattern 100 does not include a lack of data. In the present example, the data input control signal enbl is in the "L" level during the 0-th, the first, the fourth, and the fifth bits of the data, and during the first clock periods of the second and the third bits of the data. The "L" level of the data input control signal enbl causes the selector 2*h*(1) of the memory portions 2*h* in the respective memory means 2(1)~2(32) to select the outputs from the logical circuits 2*g*.

Therefore, while the data input control signal enbl is in the "L" level, the respective memory means 2(1)~2(32) in the division circuit 1 function as shift registers. Here, the flip-flop circuit 2*h*(2) of the memory portions 2*h* in the respective memory means 2(1)~2(32) take in the outputs from the logical circuits 2*g* inputted via the selector 2*h*(1) in synchronization with the rise of the clock signal CLK inputted into the clock signal input terminal 6, update their storage contents to the taken-in data, temporarily store the data, and then, output it to the corresponding output terminals 7(1)~7(32).

Here, the logical circuit 2*g* of the memory means 2(1) in the first stage carries out the exclusive-OR operation between the CRC code word except the fixed pattern 100 inputted into the code data input terminal 3 and the output from the memory portion 2*h* in the last stage of the memory means 2(32), and outputs the result of the exclusive-OR to the corresponding memory portion 2*h*. The logical circuits 2*g* of the memory means 2(2)~2(31) in the second stage and the subsequent stages in the first group carry out the exclusive-OR operation between the output of the memory portions 2*h* in the immediately preceding memory means 2(1)~2(31) and the output from the memory portion 2*h* in the memory means 2(32) in the last stage, and then output the result of the exclusive-OR to the corresponding memory portions 2*h*.

The memory portions 2*h* in the second stage and the subsequent stages in the first group directly receive outputs of the memory portions 2*h* in the immediately preceding memory means 2(1)~2(31).

On the other hand, if the CRC code word except the fixed pattern 100 inputted into the code data input terminal 3 includes a lack of data, the data input control signal enbl inputted into the data input control terminal 5 is in the "H" level. In this example, the "H" level of the data input control signal enbl is inputted during the second clock periods of the second and the third bits of data as shown in FIG. 5A. The "H" level of the data input control signal enbl causes the selector 2*h*(1) in the memory portions 2*h* in the respective memory means 2(1)~2(32) to select the output of the flip-flop circuit 2*h*(2) in their own memory portions 2*h*.

Therefore, during this period, the respective memory means 2(1)~2(32) in the division circuit 1 hold their own storage contents. Here, the flip-flop circuit 2*h*(2) of the memory portion 2*h* in the respective memory means 2(1)~2(32) takes in the output of the flip-flop circuit 2*h*(2) of its own memory portion 2*h* inputted through the selector 2*h*(1) in synchronization with the clock signal CLK inputted into the clock signal input terminal 6 to hold their storage contents.

In this way, the CRC code word except the fixed pattern 100 is divided at the division circuit 1. The remainder data of the division result is outputted from the output terminals 7(1)~7(32) of the division circuit 1.

The remainder data outputted from the output terminals 7(1)~7(32) of the division circuit 1 are inputted into the first input terminal $A_0$ of the comparison circuit 8, then compared with the CRC inherent value which is a comparison data inputted into the second input terminal $B_0$.

The comparison circuit 8 compares the inputted remainder data with the CRC inherent value for every bit. If the remainder data at every bit is identical with the CRC inherent value, it means that the formula (6) is satisfied, therefore the comparison circuit 8 outputs the comparison result signal (CRC flag) of "H" level which means the CRC code word includes no error.

On the other hand, if at least one bit of the remainder data is not identical with the CRC inherent value, the comparison circuit 8 outputs the comparison result signal (CRC flag) of "L" level which means that the CRC code word includes errors.

Then, the temporary memory means 9 takes in the comparison result signal outputted from the comparison circuit 8 from the input node D in response to rise of the clock signal inputted into the clock signal input terminal T, stores it, and at the same time outputs the storage contents as the error detecting signal through the output node Q. The clock signal inputted into the clock signal input terminal T rises at the timing that the comparison result between the remainder data and the CRC inherent value is obtained from the output terminal $C_0$ of the comparison circuit 8, that is, after all the CRC codes except the fixed pattern 100 are inputted into the division circuit 1 in synchronization with the clock signal CLK.

Since the error detecting signal for the CRC code word is outputted from the output terminal Q after temporarily stored in the temporary memory means 9, error detection for the CRC code word of the next sector can be conducted while the status of the CRC code word is being checked using the error detecting signal from the temporary memory means 9.

The reset signal rest inputted into the reset signal input terminal 4 of the division circuit 1 turns to "L" level after rise of the clock signal inputted into the clock signal input terminal T of the temporary memory means 9, which resets the division circuit 1. In other words, the respective storage contents of the flip-flop circuit 2*h*(2) in the memory portions 2*h* in all memory means 2(1)~2(32) of the division circuit 1 are reset, or initialized to "0".

Then, in the same way, the CRC code word of the next sector is divided at the division circuit 1. The remainder data of the division result is outputted and compared with the CRC inherent value at the comparison circuit 8 from which the comparison result signal is outputted. The comparison result signal is taken in to the temporary memory means 9 in response to rise of the clock signal inputted into the clock signal input terminal T, by which the error detecting signal is updated for the CRC code word of the next sector.

In the code error detecting circuit such as above construction, the remainder data obtained by dividing the CRC code word except the fixed pattern 100 is compared with the CRC inherent value, which is influenced by the contents of the fixed pattern 100 and the code lengths of the data 200 and the CRC code 300 but not by the contents of the data 200 and the CRC code 300 to obtain the error detecting signal. Therefore, it is possible to obtain the error detecting signal without inputting the fixed pattern 100 into the division circuit 1, which allows rapid error detection for the CRC code word and power saving (hereafter, the first effect).

Also, since the respective memory means 2(1)~2(32) constituting the division circuit 1 either function as the shift registers or hold their own storage contents selectively according to the data input control signal, the division circuit 1 can conduct accurate division even if the CRC code word is irregularly inputted into the division circuit 1 as an intermittent data (hereafter, the second effect).

Furthermore, since the error detecting signal for the CRC code word is temporarily stored in the temporary memory means 9, errors of the CRC code word of the next sector can be detected while the status of the CRC code word is being checked using the error detecting signal from the temporary memory means 9, in case that error detection is carried out continuously for a plurality of CRC code words, which allows rapid error detection for a plurality of CRC code words (hereafter, the third effect).

Figure 6:
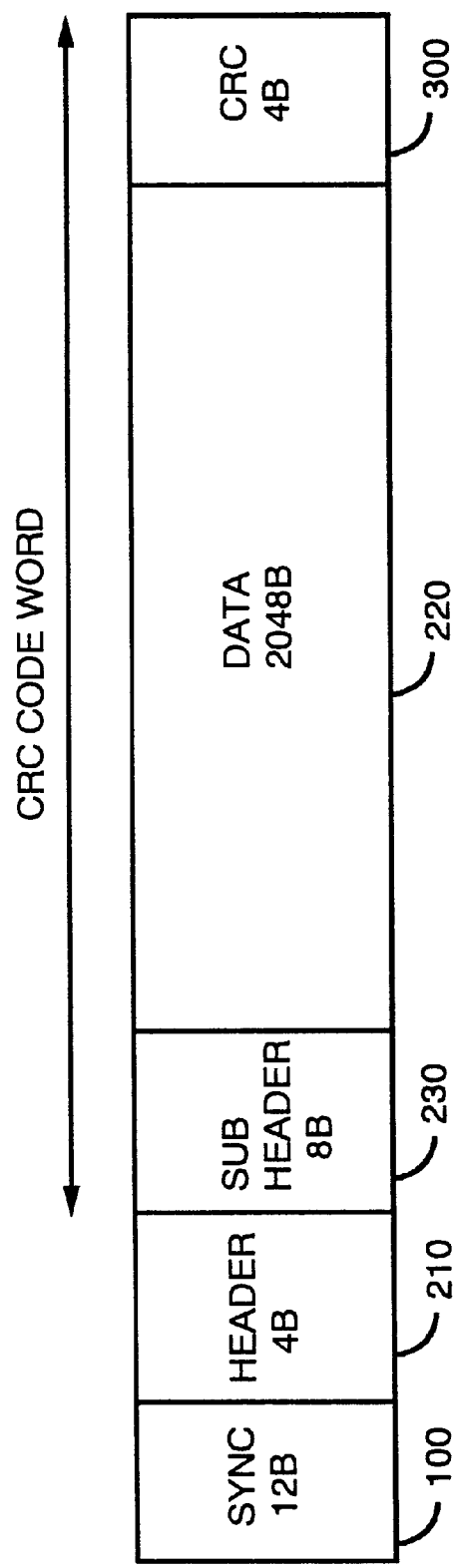
FIG. 6 is a data format diagram showing a CRC code word in CD-ROM MODE2 used in the present invention.

In the code error detecting circuit explained above, the CRC code word in CD-ROM MODE1 shown in FIGS. 3 and 4 is use, the CRC code word in CD-ROM MODE2 shown in FIG. 6 can be also used.

The CRC code word in CD-ROM MODE2 includes an eight-byte sub header portion 230, a 2048-byte data portion 220, and a four-byte CRC code 300 as shown in FIG. 6, but not includes a twelve-byte fixed pattern 100 comprising synchronization signal, and a four-byte header portion 210.

In this case, in the same way, the CRC code word is inputted one after another into the division circuit 1 in the order of the eight-byte sub header portion 230, 2048-byte data portion 220, and the four-byte CRC code 300, and division operation is carried out in the division circuit 1. Then, the remainder data of the division result is compared with the CRC inherent value at the comparison circuit 8, and the comparison result signal from the comparison circuit 8 is temporarily stored in the temporary memory means 9, and then outputted as the error detecting signal.

If the CRC code word includes no error, since the remainder data of the division result from the division circuit 1 is 0, the CRC inherent value provided to the comparison circuit 8 can be set such that all bits are 0.

In the code error detecting circuit mentioned above, although the CRC code word except the fixed pattern 100 is inputted serially bit by bit as explained above, it can be inputted by a plurality of bits. In other words, even if input data is an intermittent data, the same effects can be obtained on the condition that the remainder data of the division result obtained from the division circuit 1 is compared with the CRC inherent value at the comparison circuit 8, and the comparison result signal is stored in the temporary memory means 9, and the comparison result signal is outputted as the error detecting signal. That is, it is not important how to input the CRC code word into the division circuit.

Embodiment 2

Figure 7:
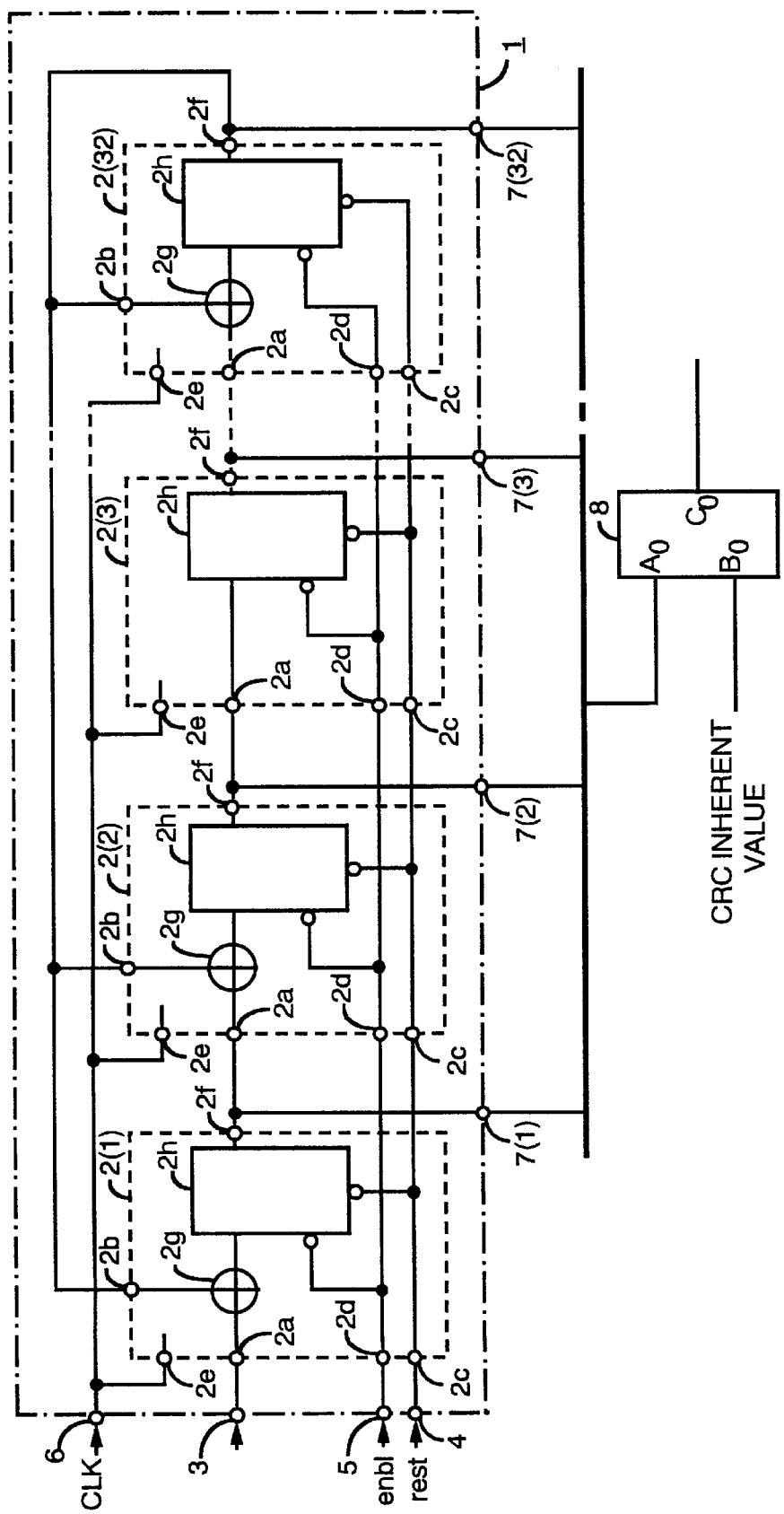
FIG. 7 shows a circuit configuration of a second embodiment of the present invention.

FIG. 7 shows a second embodiment of the present invention which differs from the first embodiment explained above only in the following construction.

In the first embodiment, the detecting means for outputting the error detecting signal, which indicates whether the CRC code word includes errors according to the remainder data of the division result from the division circuit, comprises the comparison circuit 8 and the temporary memory means 9. In the second embodiment, on the other hand, a detecting means comprises only a comparison circuit 8 and the temporary memory means 9 is eliminated. A comparison result signal from the comparison circuit 8 is directly outputted as an error detecting circuit in the second embodiment. In the second embodiment, the constructions other than the temporary memory means 9 is the same as those of the first embodiment.

The second embodiment of FIG. 7 is similar to the first embodiment of FIG. 1 and has the same reference numerals for the same or corresponding portions.

The code error detecting circuit constructed above differs from the code error detecting circuit in the first embodiment only in that the detecting signal is not stored before being outputted, therefore, it functions in the same way as the code error detecting circuit in the first embodiment, and it has the first and the second effects mentioned above in connection with the first embodiment.

Embodiment 3

Figure 8:
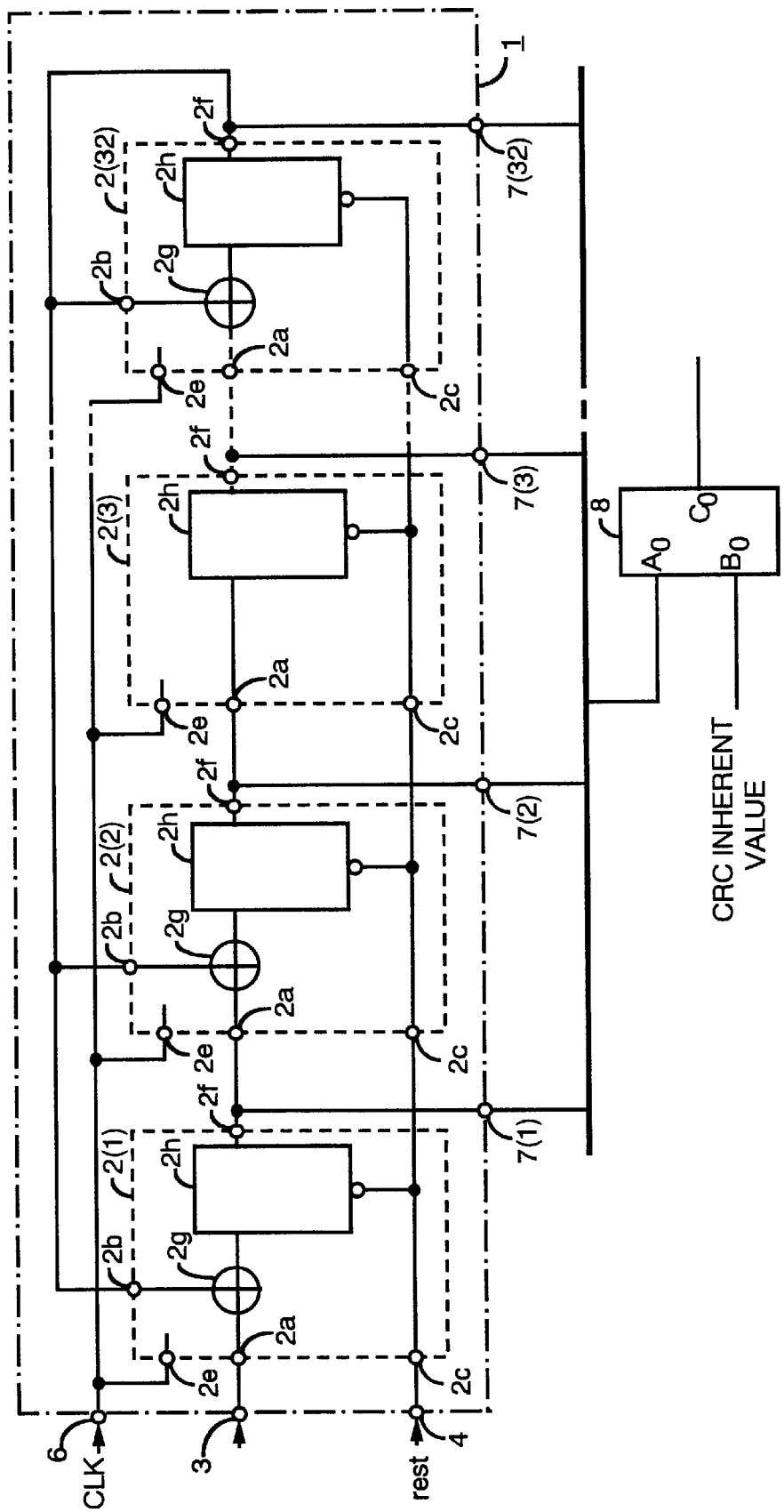
FIG. 8 shows a circuit configuration of a third embodiment of the present invention.
Figure 9:
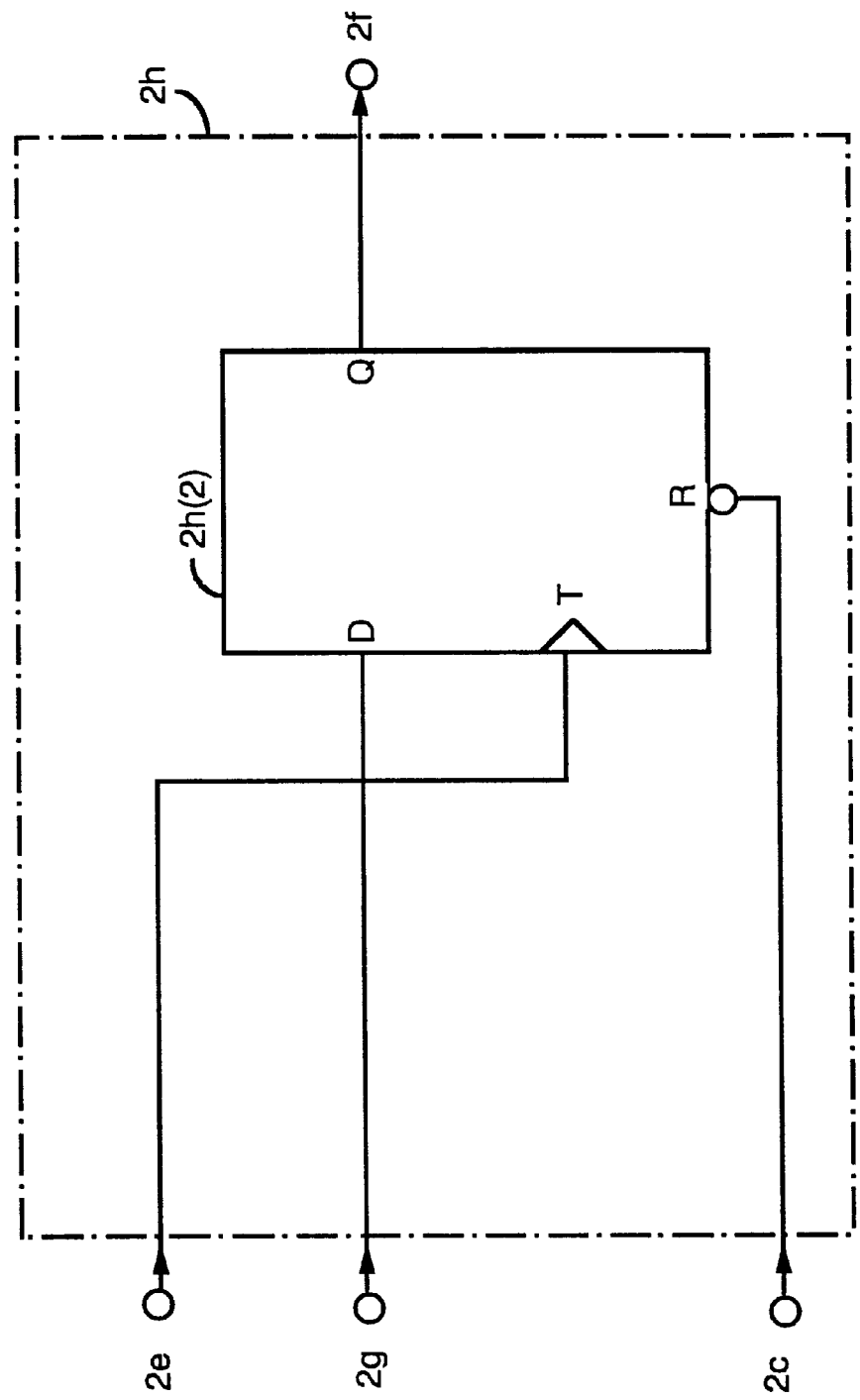
FIG. 9 shows a memory portions in memory means of the third embodiment of the present invention.

FIG. 8 shows a third embodiment of the present invention which differs from the first embodiment explained above only in the following constructions.

First, the memory portions 2h of the respective memory means 2(1)~2(32) which constitute the division circuit 1 in the first embodiment comprise the selector 2h(1) and the flip-flop circuit 2h(2). In the first embodiment, the selector 2h(1) selects the memory means 2(1)~2(32) which function as the shift registers or function to hold their own storage contents (data holding) according to the data input control signal (enable signal) enbl. On the other hand, memory means 2h in the third embodiment comprise only a flip-flop circuit 2h(2) which has an input node D for directly receiving the output from the logical circuits 2g or the output from the first input node 2a, and the selector 2h(1) is eliminated.

The memory portion 2h of the respective memory means 2(1)~2(32) includes only a flip-flop circuit 2h(2) functioning as memory circuits as shown in FIG. 2 in the third embodiment.

The flip-flop circuit 2h(2) comprises an input node D connected to the signal input node 2a, an output node Q, a reset signal input node R connected to the reset signal input node 2c, and a clock signal input node T connected to the clock signal input node 2e. In the third embodiment, the storage contents of the flip-flop circuit 2h(2) turns to "0" by the "L" level of the reset signal rest, and is activated by the "H" level of the reset signal rest. The flip-flop circuit 2h(2) takes in the input signals in response to the rise of the clock signal CLK, temporarily stores the input signal, and then outputs the storage contents through the output node Q to the output node 2f.

Second, in the first embodiment, the detecting means for outputting the error detecting signal, which indicates whether the CRC code word includes errors according to the remainder data of the division result from the division circuit 1, comprises the comparison circuit 8 and the temporary memory means 9. In the third embodiment, on the other hand, a detecting means comprises only a comparison circuit 8 and the temporary memory means 9 is eliminated. A comparison result signal from the comparison circuit 8 is directly outputted as an error detecting signal in the third embodiment.

The code error detecting circuit of the third embodiment is the same as that of the first embodiment for the other constructions. The third embodiment of FIG. 8 is similar to the first embodiment of FIG. 1 and has the same reference numerals for the same or corresponding portions.

In the code error detecting circuit constructed above, if the next bit of the CRC code word except a fixed pattern 100 is necessarily inputted into a code data input terminal 3 of the division circuit 1 in response to rise of a clock signal CLK inputted into a clock signal input terminal 6, a CRC code word except a fixed pattern 100 is divided at the division circuit 1 in the same way as in the first embodiment, and a remainder data of the division result is outputted.

In case that the CRC code word except the fixed pattern 100 inputted into the division circuit 1 does not include a lack of data, the CRC code word except the fixed pattern 100 may be inputted into the code data input terminal 3 in response to the clock signal CLK which is the same as that in the first embodiment. In case that the CRC code word except the fixed data inputted into the code data input terminal 3 is an intermittent data which lacks some data, the clock signal which rises after intermittent data may be inputted into the clock signal input terminal 6, in order to take in one data by one clock.

Therefore, the code error detecting circuit constructed above has the first effect mentioned in connection with the first embodiment.

Embodiment 4

Figure 10:
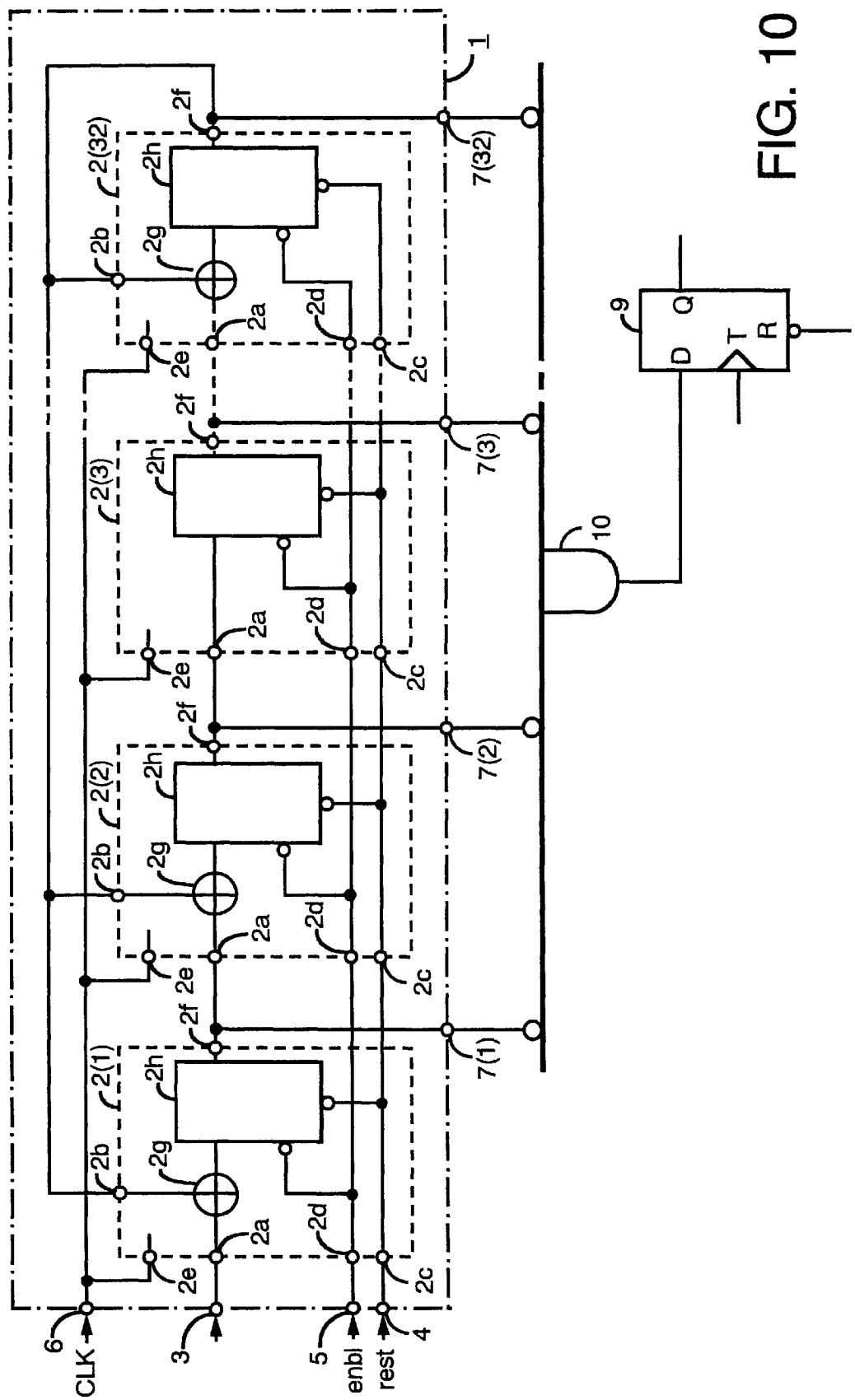
FIG. 10 shows a circuit configuration of a fourth embodiment of the present invention.

FIG. 10 shows a fourth embodiment of the present invention which differs from the first embodiment explained above only in the following construction.

In the code error detecting circuit of the first embodiment, the detecting portion for detecting whether the CRC code word includes errors according to the data based on the division result from the division circuit 1 comprises the comparison circuit 8 for comparing the remainder data of the division result from the division circuit 1 with the CRC inherent value. On the other hand, in a code error detecting circuit of the fourth embodiment, the detecting portion comprises a logical NOR circuit 10 for carrying out a logical NOR operation of a remainder data of a division result from a division circuit 1 and outputting the operation result (in the fourth embodiment, all the bits constituting the remainder data are 0 when the CRC code word does not include errors). The code error detecting circuit of the fourth embodiment is the same as that of the first embodiment for the other constructions.

The fourth embodiment of FIG. 10 is similar to the first embodiment of FIG. 1 and has the same reference numerals for the same or corresponding portions.

In the code error detecting circuit constructed above, all bits of the remainder data of the division result from the division circuit 1 need to be 0 when the CRC code word does not include errors, while at least one bit of the remainder data needs to be 1 when the CRC code word includes errors. When the remainder data indicating 0 is inputted, the logical NOR circuit 10 outputs a CRC flag indicating "H" level which means that the CRC code word does not include errors, while when the remainder data indicating the others is inputted, the logical NOR circuit 10 outputs a CRC flag indicating "L" which means that the CRC code word includes errors.

In order to output the remainder data, all bits of which are 0, from the division circuit 1 when the CRC code word does not include errors, it is necessary to satisfy any one of the following requirements. For example, first, the CRC code word in CD-ROM MODE2 shown in FIG. 6 is used as a CRC code word. Second, the CRC code word including the fixed pattern 100 is inputted into the division circuit 1 even in case of using the CRC code word in CD-ROM MODE1 shown in FIG. 4. Third, the storage contents of the flip-flop circuits $2h(1)$ of the memory means 2(1)~2(32) in the division circuit 1 is set in the initial state so that it becomes the same as the storage state after the fixed pattern is inputted one after another into the division circuit 1, as recited in the Japanese patent publication No. 4-81896 mentioned in the prior art, even in case of using the CRC code word in CD-ROM MODE1 shown in FIG. 4. Then, the CRC code word except the fixed pattern 100 is inputted into the division circuit 1. The code error detecting circuit with the construction explained above has the second and the third effects mentioned in connection with the first embodiment.

Embodiment 5

Figure 11:
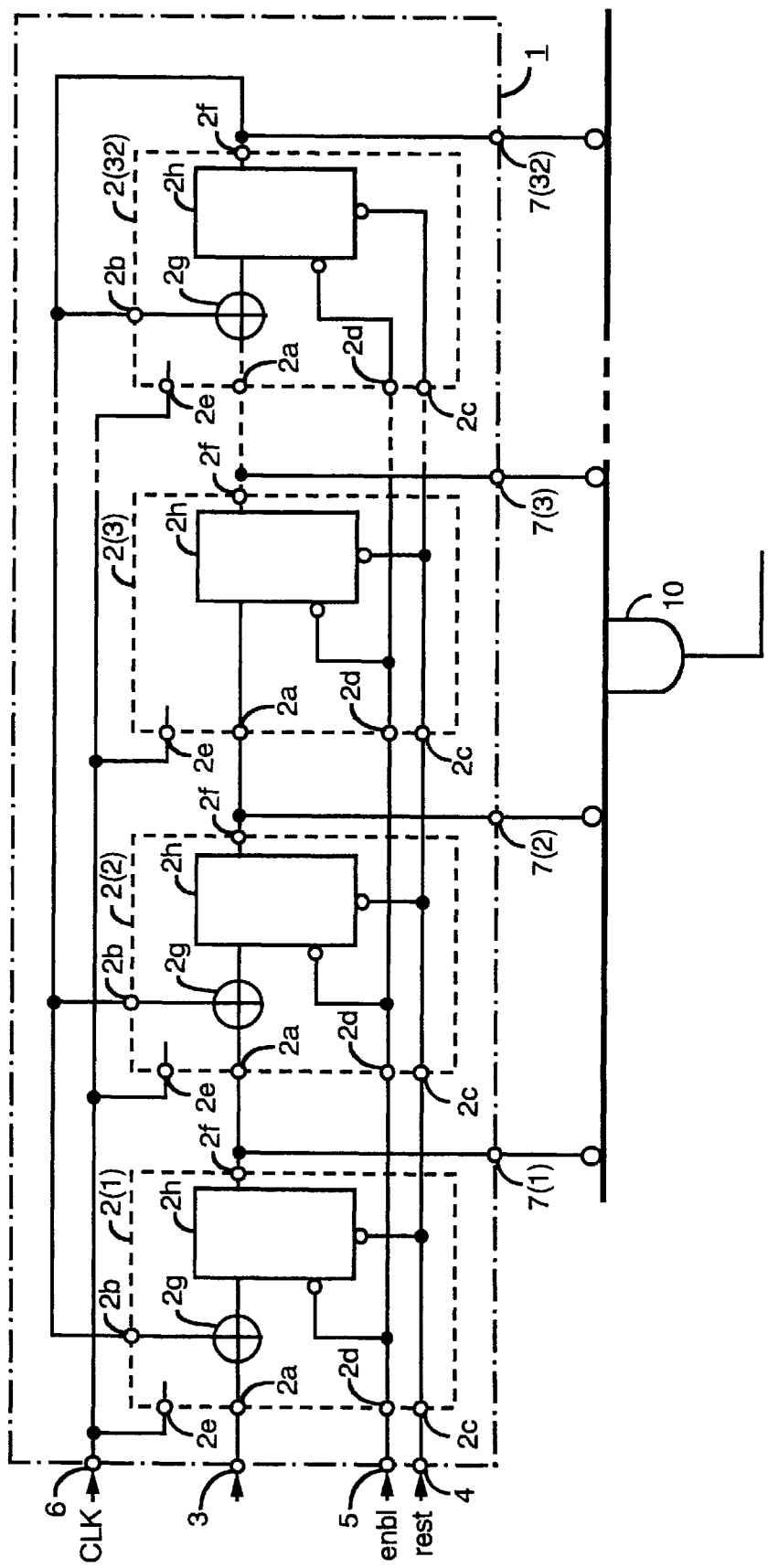
FIG. 11 shows a circuit configuration of a fifth embodiment of the present invention.

FIG. 11 shows a fifth embodiment of the present invention which differs from the fourth embodiment explained above only in the following construction.

In the code error detecting circuit of the fourth embodiment, the detecting means for outputting the error detecting signal indicating whether the CRC code word includes errors according to the remainder data of the division result from the division circuit 1, comprises the logical NOR circuit 10 and the temporary memory means 9. On the other hand, in a code error detecting circuit of the fifth embodiment, a detecting means comprises only a logical NOR circuit 10 and the temporary memory means 9 is eliminated. Further, the logical NOR circuit 10 directly outputs a CRC flag as an error detecting signal. The code error detecting circuit of the fifth embodiment is the same as that of the fourth embodiment for the other constructions.

The fifth embodiment of FIG. 11 is similar to the fourth embodiment of FIG. 10 and has the same reference numerals for the same or corresponding portions.

The code error detecting circuit of the fifth embodiment constructed above is different from that of the fourth embodiment only in that the error detecting signal is not stored before being outputted. Other than that, the code error detecting circuit of the fifth embodiment functions in the same way as that of the fourth embodiment, and has the second effect mentioned in connection with the first embodiment.

Embodiment 6

FIG. 12 shows a sixth embodiment of the present invention which differs from the fourth embodiment explained above only in the following construction.

The memory portions $2h$ of the respective memory means 2(1)~2(32) which constitute the division circuit 1 in the fourth embodiment comprise the selector $2h(1)$ and the flip-flop circuit $2h(2)$ to select making the memory means 2(1)~2(32) function as the shift registers or making the flip-flop circuit $2h(2)$ hold their own storage contents (data holding) according to the data input control signal (enable signal) enbl, while memory means in the sixth embodiment comprise only flip-flop circuit $2h(2)$ having input node D for directly receiving outputs from logical circuits $2g$ or first input node $2a$, and the selector $2h(1)$ is deleted.

A code error detecting circuit of the sixth embodiment is the same as that of the fourth embodiment for the other constructions.

The sixth embodiment of FIG. 12 is similar to the fourth embodiment of FIG. 10 and has the same reference numerals for the same or corresponding portions.

In the code error detecting circuit constructed above, if the next bit of the CRC code word is necessarily inputted into a code data input terminal 3 of the division circuit 1 in response to rise of a clock signal CLK inputted into a clock signal input terminal 6, a CRC code word except a fixed pattern 100 is divided at the division circuit 1 in the same way as in the fourth embodiment, and a remainder data of the division result is outputted.

In case that the CRC code word except the fixed pattern 100 inputted into the division circuit 1 does not include a lack of data, the CRC code word except the fixed pattern 100 may be inputted into the code data input terminal 3 in response to the clock signal CLK which is the same as that in the fourth embodiment. In case that the CRC code word except the fixed data inputted into the code data input terminal 3 is an intermittent data which lacks some data, the clock signal which rises after the next bit of the CRC code word may be inputted into the clock signal input terminal 6.

Therefore, the code error detecting circuit constructed above has the third effect mentioned in connection with the first embodiment.

What is claimed is:

1. A code error detecting circuit comprising:

a division circuit for dividing a cyclical redundancy check (CRC) code word except a fixed pattern by a generating polynomial expression of the CRC code word, the CRC code word including a data portion, a CRC portion, and a fixed pattern and outputting a remainder, and a comparison circuit for comparing the remainder from said division circuit with comparison data, the comparison data including a CRC inherent value, wherein the CRC inherent value is based on a fixed pattern of the CRC code word and code lengths of the CRC portion and the data portion of the CRC code word, and for outputting a comparison result signal indicating that the CRC code word inputted to said division circuit does not include errors when the remainder is identical to the comparison data and indicating that the CRC code word inputted to said division circuit includes errors when the remainder is not identical to the comparison data.

2. The code error detecting circuit according to claim 1 further comprising:

temporary storage memory means for temporarily storing the comparison result signal from said comparison circuit and outputting the comparison result signal stored in said temporary storage memory means as an error detecting signal.

3. The code error detecting circuit according to claim 2, wherein:

said division circuit comprises memory means arranged in a plurality of stages corresponding to a plurality of output terminals for outputting the remainder, said memory means arranged in a plurality of stages comprises a plurality of first memory circuits and a plurality of second memory circuits configured according to the generating polynomial expression, each of said first memory circuits comprises:

a first input node,
a second input node,
a first output node,
a logical circuit for exclusive-OR-ing data inputted into said first input node and said second input node, and a first memory portion for receiving an output from said logical circuit synchronously with an inputted clock signal, storing the output from said logical circuit, and outputting the data stored in said first memory portion to said first output node, and each of said second memory circuits comprises:

a third input node,
a second output node, and
a second memory portion for receiving data inputted into said third input node synchronously with an inputted clock signal, storing the data inputted into said third input node, and outputting the data stored in said second memory portion to said second output node, wherein the data portion and the CRC portion of the CRC code word are inputted into an input node of a first stage of said memory means, said first and third input nodes of said plurality of first and second memory circuits of second and succeeding stages of said memory means are respectively connected to said first and second output nodes of said plurality of first and second memory circuits of an immediately preceding stage, and said second input nodes of said plurality of first memory circuits are connected to an output node of a memory circuit of a final stave of said memory means.

4. The code error detecting circuit according to claim 2, wherein:

said division circuit comprises memory means arranged in a plurality of stages corresponding to a plurality of output terminals for outputting the remainder, said memory means arranged in a plurality of stages comprises a plurality of first memory circuits and a plurality of second memory circuits configured according to the generating polynomial expression, each of said first memory circuits comprises:

a first input node,
a second input node,
a first output node,
a logical circuit for exclusive-OR-ing data inputted into said first input node and data inputted into said second input node, and a first memory portion comprising:

a first selector including a third input node, a fourth input node for receiving an output of said logical circuit, a second output node, and a first selection input node, said first selector outputting either one of the data inputted into said third input node and the data inputted into said fourth input node to said second output node according to a data input control signal inputted into said first selection input node, and a first memory part for receiving data from said second output node synchronously with an inputted clock signal, storing the data from said second output node, and outputting the data stored in said first memory part to said first output node and said third input node, and each of said second memory circuits comprises:

a fifth input node, a third output node, and
a second memory portion comprising:

a second selector including a sixth input node for receiving a data inputted into said fifth input node, a seventh input node, a fourth output node, and a second selection input node, said second selector outputting either one of the data inputted into said sixth input node and the data inputted into said seventh input node to said fourth output node according to a data input control signal inputted into said second selection input node, and a second memory part for receiving data from said fourth output node synchronously with an inputted clock signal, storing the data from said fourth output node, and outputting the data stored in said second memory part to said third output node and said seventh input node wherein, the data portion and the CRC portion of the CRC code word are inputted into an input node of a memory circuit of a first stage of said memory means, said first and fifth input nodes of said plurality of first and second memory circuits of second and succeeding stages of said memory means are respectively connected to the respective said first and third output nodes of memory means at the said plurality of first and second memory circuits of an immediately preceding stage, and said second input nodes of said plurality of first memory circuits are connected to an output node of a memory circuit of a final stage of said memory means.

5. The code error detecting circuit according to claim 1, wherein said comparison circuit directly outputs the comparison result signal as an error detecting signal.

6. The code error detecting circuit according to claim 5, wherein:

said division circuit comprises memory means arranged in a plurality of stages corresponding to a plurality of output terminals for outputting the remainder, said memory means arranged in a plurality of stages comprises a plurality of first memory circuits and a plurality of second memory circuits configured according to the generating polynomial expression, each of said first memory circuits comprises:
a first input node,
a second input node,
a first output node,
a logical circuit for exclusive-OR-ing data inputted into said first input node and data inputted into said second input node, and
a first memory portion for receiving an output from said logical circuit synchronously with an inputted clock signal, storing the output from said logical circuit, and outputting the data stored in said memory portion to said first output node, and each of said second memory circuits comprises:
a third input node,
a second output node, and
a second memory portion for receiving data inputted into said third input node synchronously with an inputted clock signal, storing the data inputted into said third input node, and outputting the data stored in said second memory portion to said second output node, wherein the data portion and the CRC portion of the CRC code word are inputted into an input node of a first stage of said memory means, said first and third input nodes of said plurality of first and second memory circuits of second and succeeding stages of said memory means are respectively connected to said first and second output nodes of said plurality of first and second memory circuits of an immediately preceding stage, and said second input nodes of said plurality of first memory circuits are connected to an output node of a memory circuit of a final stare of said memory means.

7. The code error detecting circuit according to claim 5, wherein:

said division circuit comprises memory means arranged in a plurality of stages corresponding to a plurality of output terminals for outputting the remainder, said memory means arranged in a plurality of stages comprises a plurality of first memory circuits and a plurality of second memory circuits configured according to the generating polynomial expression, each of said first memory circuits comprises:
a first input node,
a second input node,
a first output node,
a logical circuit for exclusive-OR-ing data inputted into said first input node and data inputted into said second input node, and
a first memory portion comprising:
a first selector including a third input node, a fourth input node for receiving an output of said logical circuit, a second output node, and a first selection input node, said first selector outputting either one of the data inputted into said third input node and the data inputted into said fourth input node to said second output node according to a data input control signal inputted into said first selection input node, and
a first memory part for receiving data from said second output node synchronously with an inputted clock signal, storing the data from said second output node, and outputting the data stored in said first memory part to said first output node and said third input node, and said second memory circuits comprises:
a fifth input node, and a third output node, and
a second memory portion comprising:
a second selector including a sixth input nodes for receiving a data inputted into said fifth input node, a seventh input node, a fourth output node, and a second selection input node, said second selector outputting either one of the data inputted into said sixth input node and the data inputted into said seventh input node to said fourth output node according to a data input control signal inputted into said second selection input node, and
a second memory part for receiving output data from said fourth output node, storing the data stored in said second memory part, and outputting the data from said fourth output node synchronously with an inputted clock signal to said third output node and said seventh input node wherein, the data portion and the CRC portion of the CRC code word are inputted into an input node of a memory circuit of a first stage of said memory means, said first and fifth input nodes of said plurality of first and second memory circuits of second and succeeding stages of said memory means are respectively connected to said respective first and third output nodes of said plurality of first and second memory circuits of an immediately preceding stage, and said respective second input nodes of said plurality of first memory circuits are connected to an output node of a memory circuit of a final stage of said memory means.

8. The code error detecting circuit according to claim 1, wherein:

said division circuit comprises memory means arranged in a plurality of stages corresponding to a plurality of output terminals for outputting the remainder, said memory means arranged in a plurality of stages comprises a plurality of first memory circuits and a plurality of second memory circuits configured according to the generating polynomial expression, each of said first memory circuits comprises:

a first input node, a second input node, a first output node, a logical circuit for exclusive-OR-ing data inputted into said first input node and data inputted into said second input node, and a first memory portion for receiving an output from said logical circuit synchronously with an inputted clock signal, storing the output from said logical circuit, and outputting the data stored in said first memory portion to said first output node, and each of said second memory circuits comprises:

a third input node, a second output node, and a second memory portion for receiving data inputted into said third input node synchronously with an inputted clock signal, storing the data inputted into said third input node, and outputting the data stored in said second memory portion to said second output node, wherein the data portion and the CRC portion of the CRC code word are inputted into an input node of a first stage of said memory means, said first and third input nodes of said plurality of first and second memory circuits of second and succeeding stages of said memory means are respectively connected to said first and second output nodes of said plurality of first and second memory circuits of an immediately preceding stage, and said second input nodes of said plurality of first memory circuits are connected to an output node of a memory circuit of a final stage of said memory means.

9. The code error detecting circuit according to claim 1, wherein:

said division circuit comprises memory means arranged in a plurality of stages corresponding to a plurality of output terminals for outputting the remainder, said memory means arranged in a plurality of stages comprises a plurality of first memory circuits and a plurality of second memory circuits configured according to the generating polynomial expression, each of said first memory circuits comprises:

a first input node, a second input node, a first output node, a logical circuit for exclusive-OR-ing data inputted into said first input node and data inputted into said second input node, and a first memory portion comprising:

a first selector including a third input node, a fourth input node for receiving an output of said logical circuit, a second output node, and a first selection input node, said first selector outputting either one of the data inputted into said third input node and the data inputted into said fourth input node to said second output node according to a data input control signal inputted into said first selection input node, and a first memory part for receiving data from said second output node synchronously with an inputted clock signal, storing the data from said second output node, and outputting the data stored in said first memory part to said first output node and said third input node, and each of said second memory circuits comprises:

a fifth input node, a third output node, and a second memory portion comprising:

a second selector including a sixth input node for receiving a data inputted into said fifth input node, a seventh input node, a fourth output node and a second selection input nodes said second selector outputting either one of the data inputted into said sixth input node and the data inputted into said seventh input node to said fourth output node according to a data input control signal inputted into said second selection input node, and a second memory part for receiving data from said fourth output node synchronously with an inputted clock signal, storing the data from said fourth output node, and outputting the data stored in said second memory part to said third output node and said seventh input node wherein the data portion and the CRC portion of the CRC code word are inputted into an input node of a memory circuit of a first stage of said memory means, said first and fifth input nodes of said plurality of first and second memory circuits in second and succeeding stages of said memory means are respectively connected to said first and third output nodes of said plurality of first and second memory circuits of an immediately preceding stage, and said second input nodes of said plurality of first memory circuits are connected to an output node of a memory circuit of a final stage of said memory means.

10. The code error detecting circuit according to claim 1, wherein:

said division circuit comprises memory means arranged in a plurality of stages corresponding to a plurality of output terminals for outputting the remainder, said memory means arranged in a plurality of stages comprises a plurality of first memory circuits and a plurality of second memory circuits configured according to the generating polynomial expression, each of said first memory circuits comprises:

a first input node, a second input node, a first output node, a logical circuit for exclusive-OR-ing data inputted into said first input node and data inputted into said second input node, and a first memory portion comprising a first memory part for receiving data from said first input node synchronously with an inputted clock signal, storing the data received from said first input node, and outputting the data stored in said first memory part to said first output node, and each of said second memory circuits comprises:

a third input node, a second output node, and a second memory portion comprising a second memory part for receiving data from said third input node synchronously with an inputted clock signal, storing the data received from said third input node, and outputting the data stored in said second memory part to said second output node, wherein the data portion and the CRC portion of the CRC code word are inputted into an input node of a memory circuit of a first stage of said memory means, said first and third input nodes of said plurality of first and second memory circuits of said second and succeeding stages of said memory means are respectively connected to said first and second output nodes of said plurality of first and second memory circuits of an immediately preceding stage, and said second input nodes of said plurality of first memory circuits are connected to an output node of a memory circuit of a final stage of said memory means.

11. A code error detecting circuit comprising:

a division circuit for dividing a cyclical redundancy check (CRC) code word and by generating a polynomial expression and outputting a remainder based on a division result from said division circuit, and detecting means for receiving data based on the division result from said division circuit and outputting an error detecting signal indicating whether the CRC code word indicates errors in received data, said division circuit comprises memory means arranged in a plurality of stages corresponding to a plurality of output terminals for outputting a remainder data comprising a plurality of bits, said memory means arranged in a plurality of stages comprises a plurality of first memory circuits and a plurality of second memory circuits configured according to the generating polynomial expression, each of said first memory circuits comprises:

a first input node, a second input node, a first output node, a logical circuit for exclusive-OR-ing data inputted into said first input node and data inputted into said second input node, and a first memory portion comprising:

a first selector including a third input node, a fourth input node for receiving an output of the logical circuit, a second output node, and a first selection input node, said first selector outputting either one of the data inputted into said third input node and the data inputted into said fourth input node to said second output node according to a data input control signal inputted into said first selection input node, and a first memory part for receiving data output from said second output node synchronously with an inputted clock signal, storing the data output from said second output node, and outputting the data stored in said first memory part to said first output node and said third input node, and each of said second memory circuits comprises:

a fifth input node, a third output node, and a second memory portion comprising:

a second selector including a sixth input node for receiving a data inputted into said fifth input node, a seventh input node, a fourth output node and a second selection input node, said second selector outputting either one of the data inputted into said sixth input node and said seventh input node to said fourth output node according to a data input control signal inputted into said second selection input node, and a second memory part for receiving data from said fourth output node synchronously with an inputted clock signal, storing the data received from said fourth output node, and outputting the data stored in said second memory part to said third output node and said seventh input node, wherein the data portion and the CRC portion of the CRC code word are inputted into an input node of a memory circuit of a first stare of said memory means, said first and fifth input nodes of said plurality of first and second memory circuits of second and succeeding stages of said memory means are respectively connected to said second and fourth output nodes of said plurality of first and second memory circuits of an immediately preceding stage, and said second input nodes of said plurality of first memory circuits are connected to an output node of a memory circuit of a final stage of said memory means.

12. The code error detecting circuit according to claim 11 wherein:

the data based on the division result from said division circuit comprises a plurality of bits, and all of the bits are zero only when the inputted CRC code word does not include errors, and said detecting means comprises a logical NOR circuit for receiving the plurality of bits of the data from said division circuit, NOR-ing the plurality of bits, and outputting an operation result.

13. The code error detecting circuit according to claim 12, wherein said detecting means further comprises temporary storage memory means for temporarily storing the operation result from the logical NOR circuit and outputting the operation result as an error detecting signal.

14. A code error detecting circuit comprising:

a division circuit for dividing an inputted CRC code word and outputting remainder data of a division, wherein said division circuit divides a cyclical redundancy check (CRC) code word except a fixed pattern by a generating polynomial expression of the CRC code word, the CRC code word including a data portion, a CRC portion, and a fixed pattern, to produce a remainder, wherein the remainder comprises a plurality of bits, said division circuit comprising memory means arranged in a plurality of stages corresponding to a plurality of output terminals for outputting the remainder data, wherein said memory means arranged in the plurality of stages comprises a plurality of first memory circuits and a plurality of second memory circuits configured according to the generating polynomial expression, wherein each of said plurality of first memory circuits comprises:

a first input node, a second input node, a first output node, a logical circuit exclusive-OR-ing data inputted into said first input node and data inputted into said second input node, and a first memory portion comprising a first memory part for receiving data input from said first input node, storing the data input from said first input node, and outputting the data stored in said first memory part to said first output node, and each of said plurality of second memory circuits comprises a third input node, and a second output node, and a second memory portion comprising a second memory Part for receiving data input from said third input node, storing the data input from said third input node, and outputting the data stored in said second memory Dart to said second output node, wherein a data portion and a CRC portion of the CRC code word is inputted into an input node of a memory circuit of a first stage of said memory means, and wherein said first and third input nodes of said plurality of first and second memory circuits in second and succeeding stages of said memory means are connected to said first and second output nodes of said plurality of first and second memory circuits of an immediately preceding stage and said second input nodes of said plurality of first memory circuits are connected to an output node of a memory circuit final stare of said memory means, and detecting means for receiving data based on the division from said division circuit and outputting an error detecting signal indicating whether said CRC code work includes errors in the received data, wherein said detecting means comprises a detecting portion for detecting whether said CRC code work includes errors according to the data based on the division from said division circuit and a temporary storage memory means for temporarily storing an output from the detecting portion and outputting the storage contents of the memory means an error detecting signal.

15. The code error detecting circuit according to claim 14, wherein said first memory portion comprises a first selector including a fourth input node, a fifth input node for receiving an output of said logical circuit, a third output node, and a first selection input node, said first selector outputting either one of the data inputted into said first input node and the data inputted into said second input node to said second output node according to a data input control signal inputted into said first selection input node: and a first memory part for receiving data output from said third output node synchronously with an inputted clock signal, storing the data output from said third output node, and outputting the data stored in said first memory part to said first output node and said fourth input node of the selector, wherein said second memory portion comprises:

a second selector including a sixth input node for receiving data inputted into said third input node, a seventh input node, a fourth output node and a second selection input node, said second selector outputting either one of the data inputted into said sixth input node the data inputted into said seventh input node to said fourth output node according to a data input control signal inputted into said second selection input node, and a second memory part for receiving data from said fourth output node synchronously with an inputted clock signal, storing the data received from said fourth output node, and outputting the data stored in said second memory part to said fourth output node and said seventh input node of said second selector.

* * * * *